(12) United States Patent
Lee et al.

(10) Patent No.: US 10,108,354 B2
(45) Date of Patent: Oct. 23, 2018

(54) MEMORY CONTROLLER OPERATION

(71) Applicant: SAMSUNG ELECTRONICS CO., LTD., Suwon-si, Gyeonggi-Do (KR)

(72) Inventors: Hyunseob Lee, Ansan-si (KR); Du-Won Hong, Osan-si (KR); Moonwook Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 407 days.

(21) Appl. No.: 14/711,605

(22) Filed: May 13, 2015

(65) Prior Publication Data
US 2015/0339070 A1    Nov. 26, 2015

(30) Foreign Application Priority Data

May 20, 2014    (KR) ..................... 10-2014-0060418

(51) Int. Cl.
*G06F 13/00*    (2006.01)
*G06F 3/06*    (2006.01)
(Continued)

(52) U.S. Cl.
CPC .............. *G06F 3/0619* (2013.01); *G06F 3/06* (2013.01); *G06F 3/0655* (2013.01); *G06F 3/0679* (2013.01); *G06F 11/00* (2013.01); *G06F 12/00* (2013.01); *G06F 12/0246* (2013.01); *G11C 16/3495* (2013.01); *G11C 29/76* (2013.01); *G06F 2206/1014* (2013.01); *G06F 2212/1032* (2013.01); *G06F 2212/1036* (2013.01);
(Continued)

(58) Field of Classification Search
CPC .... G06F 3/0619; G06F 3/0679; G06F 3/0655; G06F 12/00; G06F 11/00; G06F 3/06
See application file for complete search history.

(56) References Cited

U.S. PATENT DOCUMENTS 6,092,221 A    7/2000  Hiratsuka
6,646,931 B2   11/2003 Mizoguchi et al.
(Continued)

FOREIGN PATENT DOCUMENTS

JP    2010-049581 A    3/2010
JP    2010-165364 A    7/2010
(Continued)

*Primary Examiner* — Charles Rones
*Assistant Examiner* — Han Doan
(74) *Attorney, Agent, or Firm* — Volentine, Whitt & Francos, PLLC

(57) ABSTRACT

A nonvolatile memory device includes user blocks and reserved blocks. A ratio of the number of used reserved blocks among the reserved blocks during a predetermined period to an operation count during the predetermined period is calculated by a memory controller and an end of lifetime warning signal is transmitted to an external device based on the calculated ratio. Bad blocks among the user blocks are replaced by one or more of the reserved blocks. If at least one block among the user blocks becomes a bad block, the memory controller replaces the bad block with any one of the reserved blocks, and the reserved block used indicates a reserved block replaced with at least one of the user blocks. The operation count can be an erase count or a program count of the nonvolatile memory device, or a time count indicating usage time.

14 Claims, 18 Drawing Sheets

(51) Int. Cl.
  *G06F 12/00* (2006.01)
  *G06F 11/00* (2006.01)
  *G11C 16/34* (2006.01)
  *G11C 29/00* (2006.01)
  *G06F 12/02* (2006.01)
  *G11C 29/04* (2006.01)

(52) U.S. Cl.
  CPC .......... *G06F 2212/7205* (2013.01); *G11C 2029/0409* (2013.01)

(56) References Cited

U.S. PATENT DOCUMENTS

| | | |
|---|---|---|
| 7,512,847 B2 | 3/2009 | Bychkov et al. |
| 7,523,013 B2 | 4/2009 | Gorobets et al. |
| 7,596,656 B2 | 9/2009 | Elhamias |
| 7,778,977 B2 | 8/2010 | Gorobets et al. |
| 8,531,900 B2 | 9/2013 | Danilak |
| 2007/0266200 A1* | 11/2007 | Gorobets ............ G06F 11/008 711/103 |
| 2009/0040827 A1* | 2/2009 | Kim .................... G11C 29/76 365/185.09 |
| 2009/0132756 A1 | 5/2009 | Hsieh |
| 2010/0082890 A1* | 4/2010 | Heo ................. G06F 12/0246 711/103 |
| 2012/0030499 A1* | 2/2012 | Swaine .................... G06F 1/14 713/502 |
| 2012/0144145 A1 | 6/2012 | Shin |

FOREIGN PATENT DOCUMENTS

| | | |
|---|---|---|
| JP | 2013-149112 A | 8/2013 |
| KR | 10-0837826 B1 | 6/2008 |

\* cited by examiner

| BLK1 | E/C_1 |
|------|-------|
| BLK2 | E/C_2 |
| BLK3 | E/C_3 |
| BLK4 | E/C_4 |
| ⋮    |       |
| BLKn | E/C_n |

| 1st period | R1 |
|---|---|
| 2nd period | R2 |
| 3rd period | R3 |

⋮

| n-1th period | Rn-1 |
|---|---|
| nth period | Rp |

MEMORY CONTROLLER OPERATION

CROSS-REFERENCE TO RELATED APPLICATION

This U.S. non-provisional patent application claims priority under 35 U.S.C. § 119 of Korean Patent Application No. 10-2014-0060418, filed on May 20, 2014, the entire contents of which are hereby incorporated by reference.

FIELD OF THE INVENTIVE CONCEPT

The inventive concept relates to semiconductor memory devices, and more particularly to memory control for non-volatile memory.

BACKGROUND AND SUMMARY

A semiconductor memory device is a memory device embodied using a semiconductor such as silicon Si, germanium Ge, gallium arsenide GaAs, indium phosphide InP, etc. A semiconductor memory device can be a volatile or a nonvolatile semiconductor memory device.

A volatile memory device loses stored data when its power supply is interrupted. Examples of the volatile memory device include a static RAM (SRAM), a dynamic RAM (DRAM), a synchronous DRAM (SDRAM), etc. A nonvolatile memory device retains stored data even when power supply is interrupted. Examples of a nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

Since a flash memory has high operation speed and low power consumption, it is being used in a variety of fields. In a solid-state flash memory cell, data can be written onto the medium of the memory cell, this data can be erased from the medium, and new data can be written onto the same medium. The sequence of erasing data that has been written to a solid-state flash memory cell and then writing over it again is called a solid-state-storage program-erase (P/E) cycle. Each such cycle causes a small amount of physical damage to the medium of the flash memory cell. Over time this damage accumulates, so that there is a limit to the number of P/E cycles that can be performed before the accumulated damage renders the cell unusable. Accordingly, counting the number of P/E cycles that have been performed can indicate how close the cell is to failure, and/or when the cell can no longer be relied on.

Accordingly, the lifetime of a flash memory may be determined based on a P/E cycle or program/erase count. For example, if an average erase count of a flash memory is greater than a critical value, reliability of data stored in a flash memory is not guaranteed. Thus, to increase failure prediction and failure avoidance efficiency of a flash memory, a warning message may be transmitted to a user based on average erase count to warn of approaching end-of-life of the flash memory. However, the user's pattern of use may change the lifetime of the flash memory, estimating the lifetime of the flash memory simply on the basis of the average erase count may be problematic. Accordingly, it would be useful to find other methods by which to determine and warn the user that the flash memory end of lifetime or failure may be near.

In one aspect of the inventive concept revealed herein, a method of operating a memory controller that controls a nonvolatile memory device including a plurality of user blocks and a plurality of reserved blocks comprises calculating a ratio of the number of used reserved blocks among the plurality of reserved blocks during a predetermined period to an operation count during the predetermined period, transmitting an end of lifetime warning signal to an external device based on the calculated ratio, and if one or more blocks among the user blocks become bad, causing the memory controller to replace the one or more bad blocks with one or more of the reserved blocks. The number of used reserved blocks signifies the number of the reserved blocks that have been used to replace the one or more bad blocks, and the operation count is at least one of an erase count of the nonvolatile memory device, a program count of the nonvolatile memory device, and/or a time count indicating usage time.

In another aspect of the inventive concept, a method of operating a memory controller that controls a nonvolatile memory device including a plurality of user blocks and a plurality of reserved blocks comprises calculating, for each period of a plurality of periods, a respective ratio of the number of used reserved blocks among the reserved blocks to an operation count of the nonvolatile memory device, storing the respective calculated ratios, estimating a current ratio based at least in part on the stored ratios, transmitting an end of lifetime warning signal to an external device based on the estimated current ratio, and causing the memory controller to replace the one or more bad blocks with one or more of the reserved blocks if one or more blocks among the user blocks become bad, wherein the number of used reserved blocks signifies the number of the reserved blocks that have been used to replace the one or more bad blocks, and the operation count is at least one of an erase count, a program count, and/or usage time of the nonvolatile memory device.

In yet another aspect of the inventive concept, a user system for memory control comprises a non-volatile memory including a plurality of user memory blocks and a plurality of reserved memory blocks, and a memory controller configured to control the nonvolatile memory by calculating a ratio of the number of used reserved blocks among the plurality of reserved blocks during a predetermined period to an operation count during the predetermined period, transmitting an end of lifetime warning signal to an external device based on the calculated ratio, and causing the memory controller to replace the one or more bad blocks with one or more of the reserved blocks if one or more blocks among the user blocks become bad, wherein the number of used reserved blocks signifies the number of the reserved blocks that have been used to replace the one or more bad blocks, and the operation count is at least one of an erase count of the nonvolatile memory device, a program count of the nonvolatile memory device, and/or a time count indicating usage time.

BRIEF DESCRIPTION OF THE DRAWING FIGURES

Various possible embodiments of the inventive concept will be described below in more detail with reference to the accompanying drawings. Like numbers refer to like elements throughout.

FIG. 16 is a drawing for explaining an operation of the memory controller of FIG. 15.

DETAILED DESCRIPTION

Figure 1:
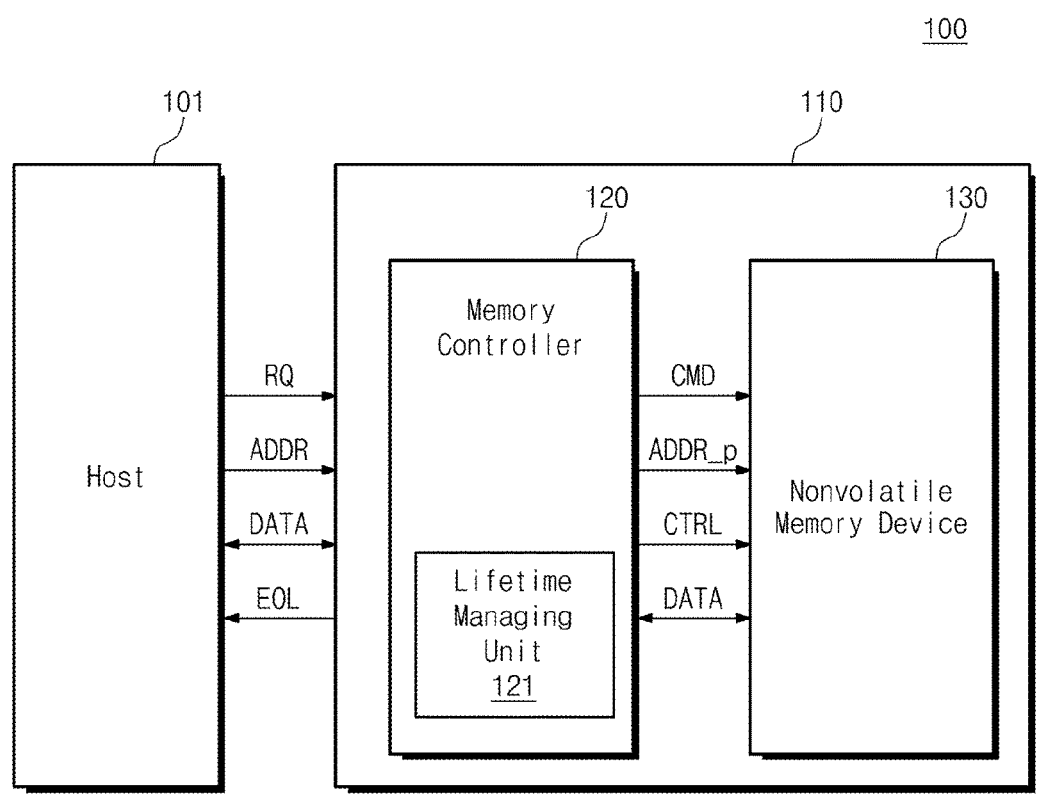
FIG. 1 is a block diagram illustrating a user system in accordance with an embodiment of the inventive concept.

Exemplary embodiments of the inventive concepts are described more fully below. However, specific structural and functional details disclosed herein are merely representative for purposes of describing exemplary embodiments of the inventive concepts. The inventive concept may, however, be embodied in different forms and should not be construed as being limited to the embodiments set forth herein. Rather, these embodiments are provided and explained so that this disclosure will be thorough and complete, and will fully convey the scope of the inventive concept and the claimed subject matter to those skilled in the art.

Accordingly, while exemplary embodiments of the inventive concepts are capable of various modifications and alternative forms, and are shown and explained by way of example in the drawings and detailed description herein, the claimed subject matter is not limited to the illustrated and explained exemplary embodiments. Rather, the claimed subject matter is meant to cover all modifications, equivalents, and alternatives falling within the scope of exemplary embodiments of the inventive concepts and equivalents thereof. Like numbers refer to like elements throughout the description.

It will be understood that, although the terms first, second, etc. may be used herein to describe various elements, these elements are not limited by these terms, which are used only to distinguish one element from another. For example, a first element could be termed a second element, and, similarly, a second element could be termed a first element, without departing from the scope of exemplary embodiments of the inventive concepts. As used herein, the term "and/or" includes any and all combinations of one or more of the associated listed items. As used herein, a statement of the form "One of A and B," or "One of A, B, and C," etc. does not mean one of every one of the categories A, B, etc., but conversely means any of either A, B, or C, nonexclusively, including any combination of one or more of A and B, etc.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to limit the exemplary embodiments or any of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as would be commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In various of the exemplary embodiments, a nonvolatile memory system may detect the number of reserved blocks used during a predetermined operation count (for example, an erase count, a program count, a time count, and etc.). The nonvolatile memory system may estimate remaining lifetime of the nonvolatile memory system based on a ratio of the number of detected reserved blocks to the predetermined operation count. In this way, the lifetime of the nonvolatile memory system may be more accurately estimated as compared with a conventional technique.

Referring to FIG. 1, a user system 100 includes a host 101 and a nonvolatile memory system 110. The user system 100 may be provided by any of a number of types of computing systems, for example an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, etc. The host 101 may be a computer within the user system 100 acting as a host computer for example.

The host 101 may transmit various signals to write data into, or read stored data from, a nonvolatile memory system 110. For example, the host 101 may transmit a request RQ, an address ADDR, and data DATA to, and receive data from, the nonvolatile memory system 110. The host 101 and the nonvolatile memory system 110 may communicate based on any one of various interfaces such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer small interface) protocol, an ESDI (enhanced small disk interface) protocol, an IDE (integrated drive electronics) protocol, an MIPI (mobile industry processor interface) protocol, a NVMe (nonvolatile memory-express) protocol, etc.

The nonvolatile memory system 110 may include a memory controller 120 and a nonvolatile memory device 130. The memory controller 120 may control the nonvolatile memory device 130 in response to signals received from the host 101. For example, the memory controller 120 may receive a read or write request RQ and an address ADDR from the host 101 and transmit a command CMD, a physical address ADDR_p, and a control signal CTRL to the nonvolatile memory device 130 in order to write data into or read stored data from, the nonvolatile memory device 130 in response to the received signals. The memory controller 120 may translate the address ADDR received from the host 101 into a physical address ADDR_p of the nonvolatile memory device 130, and may transmit the translated physical address ADDR_p to the nonvolatile memory device 130.

The memory controller 120 may control an erase operation for the nonvolatile memory device 130. For example, the memory controller 120 may control the nonvolatile memory device 130 so that invalid blocks of the nonvolatile memory device 130 are erased.

The nonvolatile memory device 130 may operate in response to the signals received from the memory controller 120. The nonvolatile memory device 130 may have data written to it or may transmit stored data to the memory controller 120 in response to the command CMD, the physical address ADDR_p, and the control signal CTRL. The nonvolatile memory device 130 may be for example a NAND flash memory device. However, the inventive concept is not limited thereto and the nonvolatile memory device 130 may include nonvolatile memory devices such as a PRAM, an ReRAM, a MRAM, a FRAM, etc.

The memory controller 120 may include a lifetime managing unit 121 that may manage the lifetime of the nonvolatile memory device 130 since, for example, if the program/erase count of the nonvolatile memory device 130 is more than a critical value, reliability of data stored in the nonvolatile memory device 130 may not be guaranteed.

The lifetime managing unit 121 may estimate the expected lifetime of the nonvolatile memory device 130 based on an operation count (e.g., an erase count, a program count, a time count, and etc.) and usage of reserved blocks of the nonvolatile memory device 130. In exemplary embodiments, the expected lifetime of the nonvolatile memory device 130 may be estimated based on the average erase count, the average program count, and/or the usage time.

After determining the expected remaining lifetime, the memory controller 120 may transmit an end of lifetime warning signal EOL to the host 101 to notify the host 101 that the remaining expected lifetime of the nonvolatile memory device 130 is shorter than a reference lifetime.

In response to the end of lifetime warning signal EOL received from the memory controller 120, the host 101 may notify the user of the lifetime of the nonvolatile memory system 110, or may perform another operation (e.g., data backup) in response.

Figure 2:
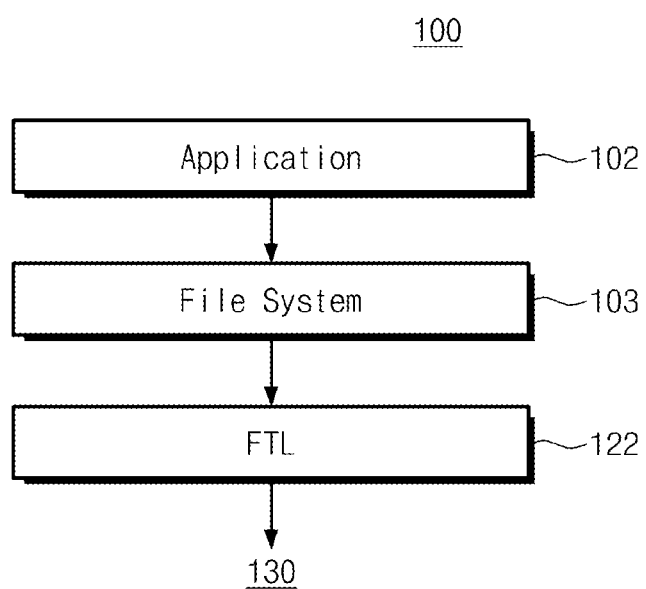
FIG. 2 is a block diagram illustrating a software layer of the user system of FIG. 1.

Referring to FIGS. 1 and 2, a software layer of the user system 100 in one embodiment includes an application 102, a file system 103, and a flash translation layer (FTL) 122. The application 102 represents various application programs being driven in the user system 100. For example, the application 110 may include an operating system, a text editor, a web browser, an image player, a game program, etc.

If a file is being stored or data is being used by the application 102, the file system 103 may organize the file or the data. For example, the file system 103 may provide a logical address ADDR of a file or data to the nonvolatile memory system 110. The file system 103 may have a different form depending on an operating system OS of the host 101. For example, the file system 103 may include a FAT (file allocation table), FAT32, NTFS (NT file system), HFS (hierarchical file system), JFS2 (journaled file system2), XFS, ODS-5 (on-disk structure-5), UDF, ZFS, UFS (unix file system), ext2, ext3, ext4, reiserFS, reiser4, ISO 9660, Gnome VFS, or winFS, etc. The file system 103 may define data by a sector unit. The file system 103 may be driven by the host 101.

The flash translation layer (FTL) 122 may provide an interface between the host 101 and the nonvolatile memory device 130 so that the nonvolatile memory device 130 is effectively used. For example, the nonvolatile memory device 130 may write and read data by a page unit. Since the file system 103 manages data or a file by a sector unit, the FTL 122 receives a logical address ADDR to translate the received logical address ADDR into a physical address ADDR_p that may be used in the nonvolatile memory device 130. The FTL 122 may manage an address translation operation using a mapping table (not shown). The FTL 122 may perform operations such as garbage collection (GC) and wear leveling (arranging data so that erasures and re-writes are distributed evenly across a number of data blocks so that no single erase block prematurely fails due to a high concentration of write cycles). For example, the FTL 122 may manage a program/erase count of memory blocks included in the nonvolatile memory device 130 and perform wear leveling so that a program/erase count of memory blocks is standardized based on the managed program/erase count.

The FTL 122 may divide a plurality of memory blocks included in the nonvolatile memory device 130 into a user block and a reserved block to manage them. The FTL 122 may perform the address translation operation so that data is written in the user block. If one of the user blocks goes bad, the FTL 122 may perform a "remap operation," by replacing the bad user block with one of the reserved blocks.

Figure 3:
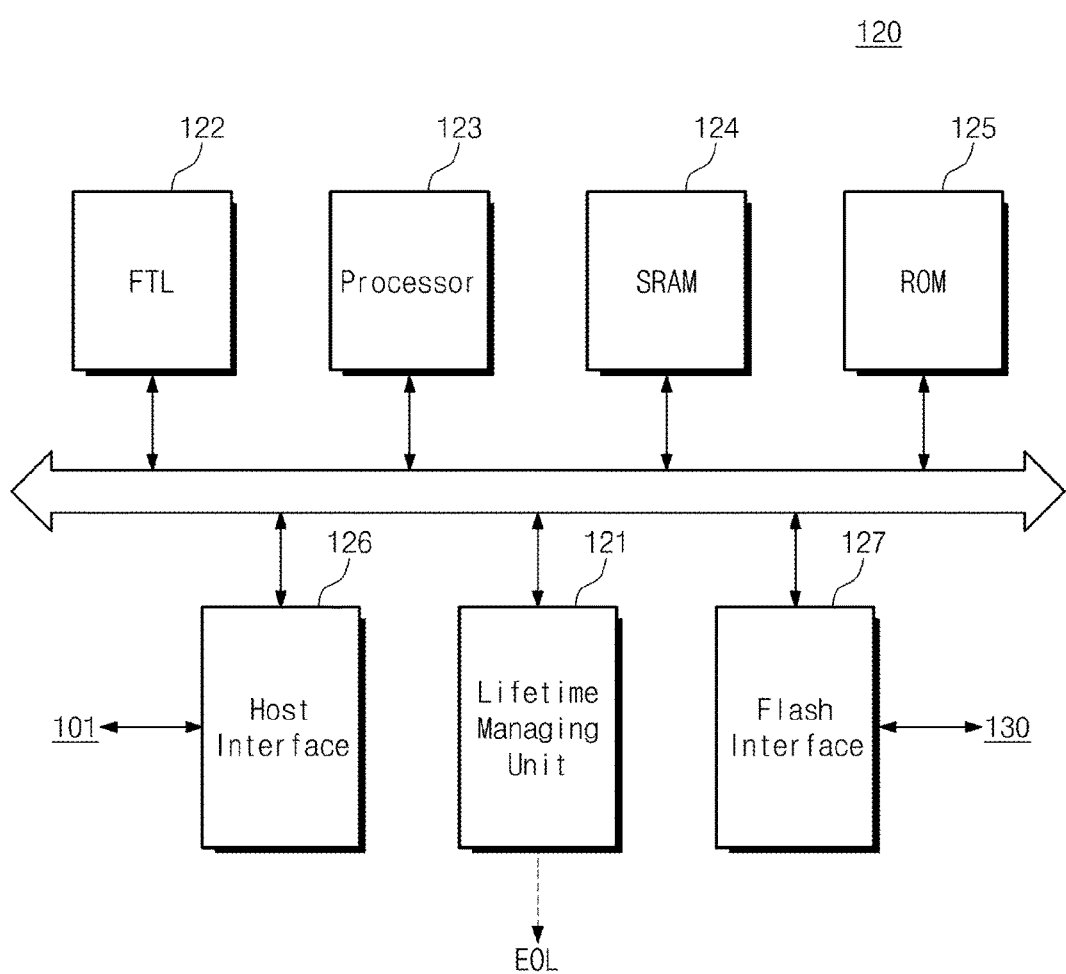
FIG. 3 is a block diagram illustrating in detail the memory controller of FIG. 1.

Referring to FIGS. 1 and 3, the memory controller 120 includes a lifetime managing unit 121, a flash translation layer (FTL) 122, a processor 123, a SRAM 124, a ROM 125, a host interface 126, and a flash interface 127.

The lifetime managing unit 121 may estimate and manage the lifetime of the nonvolatile memory system 110. For example, the lifetime managing unit 121 may keep an erase count of the nonvolatile memory device 130, and may manage the number of used reserved blocks of the nonvolatile memory device 130. The lifetime managing unit 121 may estimate and manage the lifetime of the nonvolatile memory system 110 or the nonvolatile memory device 130 based on the erase count and the number of used reserved blocks.

The lifetime managing unit 121 may transmit an end of lifetime warning signal EOL to the host 101 via the host interface 126 as needed, for example if the remaining lifetime of the nonvolatile memory system 110 is shorter than a reference lifetime.

In some exemplary embodiments, the lifetime managing unit 121 may be provided as a software layer and may be included in the FTL 122. The lifetime managing unit 121 may be driven by the processor 123, and may be stored in the ROM 125 as firmware, or in the SRAM 124.

The processor 123 may control overall operation of the memory controller 120 and may drive the lifetime managing unit 121 and the FTL 122 being provided as the software layer. The SRAM 124 may be used as a buffer memory, a cache memory, an operation memory, etc. The ROM 125 may store information required when the memory controller 120 operates as firmware.

The memory controller 110 may communicate with the host 101 via the host interface 126 and may communicate with the nonvolatile memory device 130 via the flash interface 127.

Figure 4:
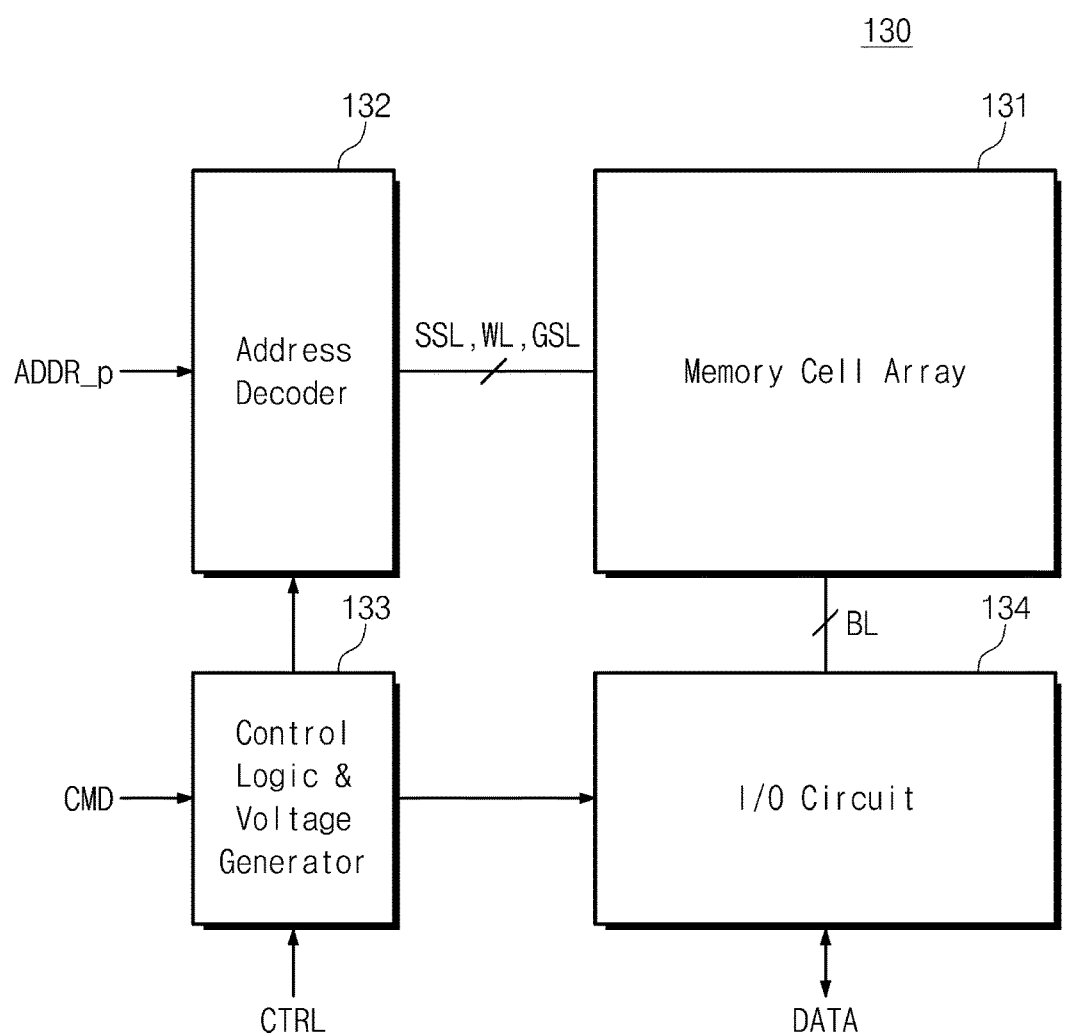
FIG. 4 is a block diagram illustrating in detail the non-volatile memory device of FIG. 1.

Referring to FIGS. 1 and 4, the nonvolatile memory device 130 includes a memory cell array 131, an address decoder 132, control logic & voltage generator 133, and an input/output circuit 134.

The memory cell array 131 may include a plurality of memory blocks, each including a plurality of strings that each comprise a plurality of memory cells. Each memory cell may be a single level cell SLC storing one bit, or a multi level cell MLC storing at least two bits.

The address decoder 132 may be connected to the memory cell array 131 through a string select line SSL, a ground select line GSL and a plurality of word lines WL. The address decoder 132 may receive a physical address ADDR_p and decode the received physical address ADDR_p. The address decoder 132 may control voltages of the string select line SSL, the ground select line GSL and the word lines WL.

The control logic & voltage generator 133 may control the address decoder 132 and the input/output circuit 134 in response to a command CMD and a control signal CTRL. The control logic & voltage generator 133 may generate various voltages as required during operation of the nonvolatile memory device 130, for example a plurality of select read voltages, a plurality of unselect read voltages, a plurality of program voltages, a plurality of pass voltages, a plurality of erase voltages, etc.

The input/output circuit 134 is connected to the memory cell array 131 through a plurality of bit lines BL and may operate as a write driver and a sense circuit. For example, the input/output circuit 134 may receive data to be written in the memory cell array 131, control the plurality of bit lines BL based on the received data, and may read data stored in the memory cell array 131 and transmit it to memory controller 120.

Figures 5, 6:
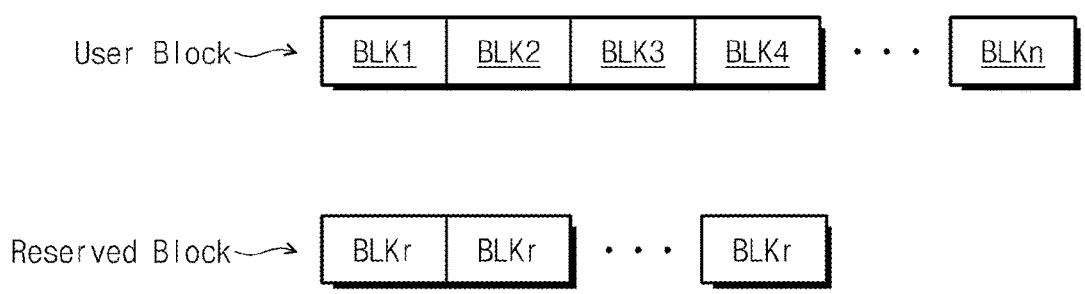
FIG. 5 is a drawing illustrating a plurality of memory blocks included in the memory cell array of FIG. 4.
FIG. 6 is a drawing for explaining a wear leveling operation of the flash translation layer (FTL) of FIG. 2.

FIG. 5 is a drawing illustrating a plurality of memory blocks included in a memory cell array illustrated in FIG. 4. For brevity of description, unnecessary constituent elements for explaining a user block and a reserved block are omitted. A memory block unit in this embodiment is used to estimate remaining lifetime, though the inventive concept is not limited thereto. In other possible embodiments, a super block unit, a sub block unit, a word line unit, a page unit or a memory cell unit may be used.

Referring to FIGS. 2 and 5, the memory cell array 131 includes a plurality of memory blocks BLK1~BLKn, BLKr. A flash translation layer (FTL) 122 may use the memory blocks BLK1~BLKn as user blocks and use the remaining memory blocks BLKr as reserved blocks, and may perform an address translation operation so that data received from the host 101 is written in the proper user memory block BLK1~BLKn.

Referring to FIGS. 5 and 6, the FTL 122 in this embodiment manages the memory blocks BLK1~BLKn as a user block. In this case, the FTL 122 may manage an erase count (E/C_1~E/C_n) of each of the memory blocks BLK1~BLKn, assigning and managing the memory blocks BLK1~BLKn to standardize the erase count (E/C_1~E/C_n) of the memory blocks BLK1~BLKn. A specific memory block among the memory blocks BLK1~BLKn may be used frequently as a user block to reduce frequency of bad block occurrence.

Figure 7:
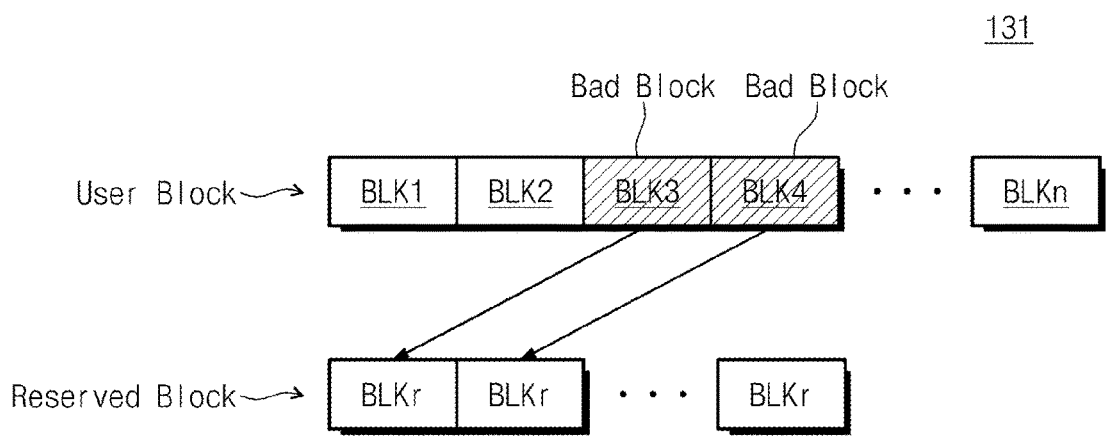
FIG. 7 is a drawing for explaining a wear leveling operation of the FTL of FIG. 2.

Referring to FIGS. 2 and 7, the FTL 122 manages memory blocks, using memory blocks BLK1~BLKn as user blocks and using the remaining memory blocks BLKr as reserved blocks.

Each of the memory blocks BLK1~BLKn may become a bad block upon being erased a certain number of times. For example, data stored in the third and fourth memory blocks BLK3 and BLK4 may be lost when the erase counts of those blocks exceed a certain value. Accordingly, when the erase counts of the third and fourth memory blocks BLK3 and BLK4 exceed a reference value, the FTL 122 may recognize the third and fourth memory blocks BLK3 and BLK4 as bad blocks. They may also be recognized as bad blocks if data within them cannot be restored due to external factors (external shock, heat, etc.)

When the third and fourth memory blocks BLK3 and BLK4 are recognized as bad, the FTL 122 may replace them with respective ones of the reserved blocks BLKr, for example by updating a mapping table (not shown) so that logical addresses ADDR corresponding to the third and fourth memory blocks BLK3 and BLK4 are mapped to the respective reserved blocks BLKr.

As described with reference to FIGS. 5 through 7, the FTL 122 may perform wear leveling based on the erasure count of the user blocks, and if a user block becomes a bad block, the FTL 122 may replace it with a reserved block. As the operation count of the nonvolatile memory system 110 increases, the used reserved block ratio (described below) may be expected to increase.

Figure 8:
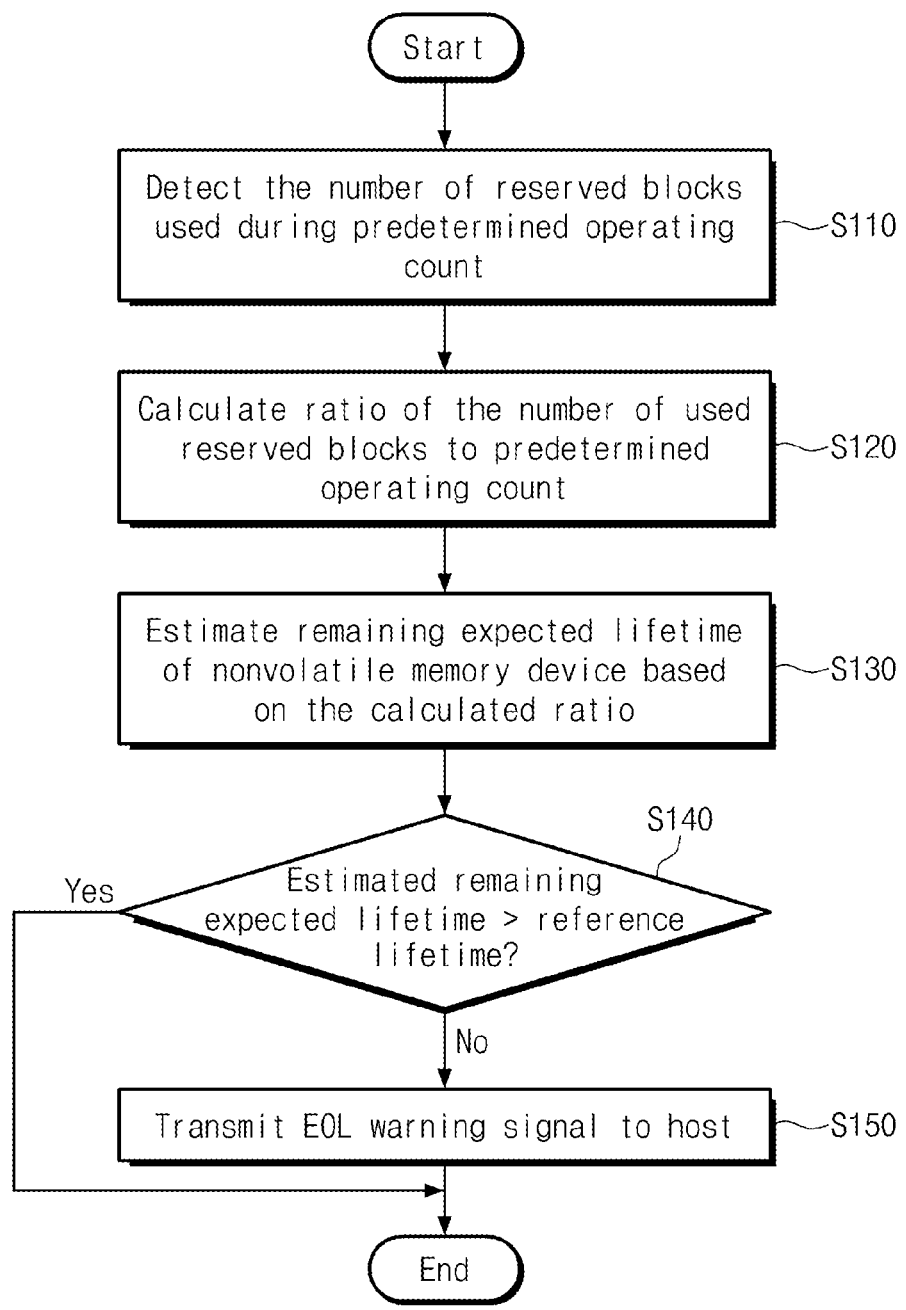
FIG. 8 is a flowchart illustrating an operating method of the memory controller of FIG. 3.

FIG. 8 is a flowchart illustrating an operating method of a memory controller illustrated in FIG. 3. For brevity of description, the lifetime of the nonvolatile memory device 130 is described as being based on an average erase count (E/C). It is also assumed that the memory controller 120 estimates the lifetime of the nonvolatile memory device 130 based on the erase count (E/C) and the number (RB) of used reserved blocks at a given time. However, the inventive concept is not limited thereto and the lifetime of the nonvolatile memory device 130 may be represented by an average program count, usage time, an I/O count, etc. The number (RB) of used reserved blocks may be represented by a remap operation count.

Referring to FIGS. 3 and 8, in a step S110, the memory controller 120 may detect the number of reserved blocks used during a predetermined operation count. The operation count may be an erase count of the nonvolatile memory device 130, for example. The operation count could also be a program count of the nonvolatile memory device 130, or a time count indicating time usage of the nonvolatile memory device 130. For discussing this particular embodiment we will assume that an operation count is an erase count, though the inventive concept is not limited thereby.

Accordingly, in some embodiments the memory controller 120 may detect (S110) the number of reserved blocks that have been used so far during the operating count, and may calculate (S120) the ratio of the number of used reserved blocks to the predetermined erase count, i.e., the reference value discussed earlier. The ratio indicates a using ratio of the reserved block with respect to the predetermined erase count.

It will be understood that the higher this ratio is, the closer to failure the memory device 130 could be, since the calculated ratio indicates the number of reserved blocks used during the predetermined erase count. Accordingly, the memory controller 120 may estimate (S130) the remaining expected lifetime based on the calculated ratio. For example, the estimate of the remaining lifetime of the nonvolatile memory device 130 based on the calculated ratio and the number of reserved blocks remaining unused.

The memory controller 120 may then compare (S140) the remaining estimated lifetime with the reference lifetime, which may indicate a predetermined value for the expected lifetime at which a warning signal should be given, or could indicate the entire expected lifetime (or guaranteed lifetime) of the nonvolatile memory device 130, which can be compared (S140) to the estimated total lifetime. For example, the reference lifetime may be a value corresponding 20% of the entire expected lifetime of the nonvolatile memory device 130.

If the remaining estimated lifetime is less than (or less than or equal to) the reference lifetime, the memory controller 120 may transmit (S150) an end of lifetime warning or end-of-life (EOL) signal to the host. Conversely, an EOL signal will not yet be transmitted if the remaining estimated lifetime exceeds the reference lifetime.

The operation described above of the memory controller 120 may be performed by the lifetime managing unit 125 or the processor 123 driving the lifetime managing unit 125.

Other actions are possible. For example, the memory controller 120 may transmit an end of lifetime warning signal EOL to the host 101 if the calculated ratio is greater than a predetermined value. In exemplary embodiments, the calculated ratio may be stored in a separate storage circuit (for example, a register, a fuse, etc.)

Figure 9:
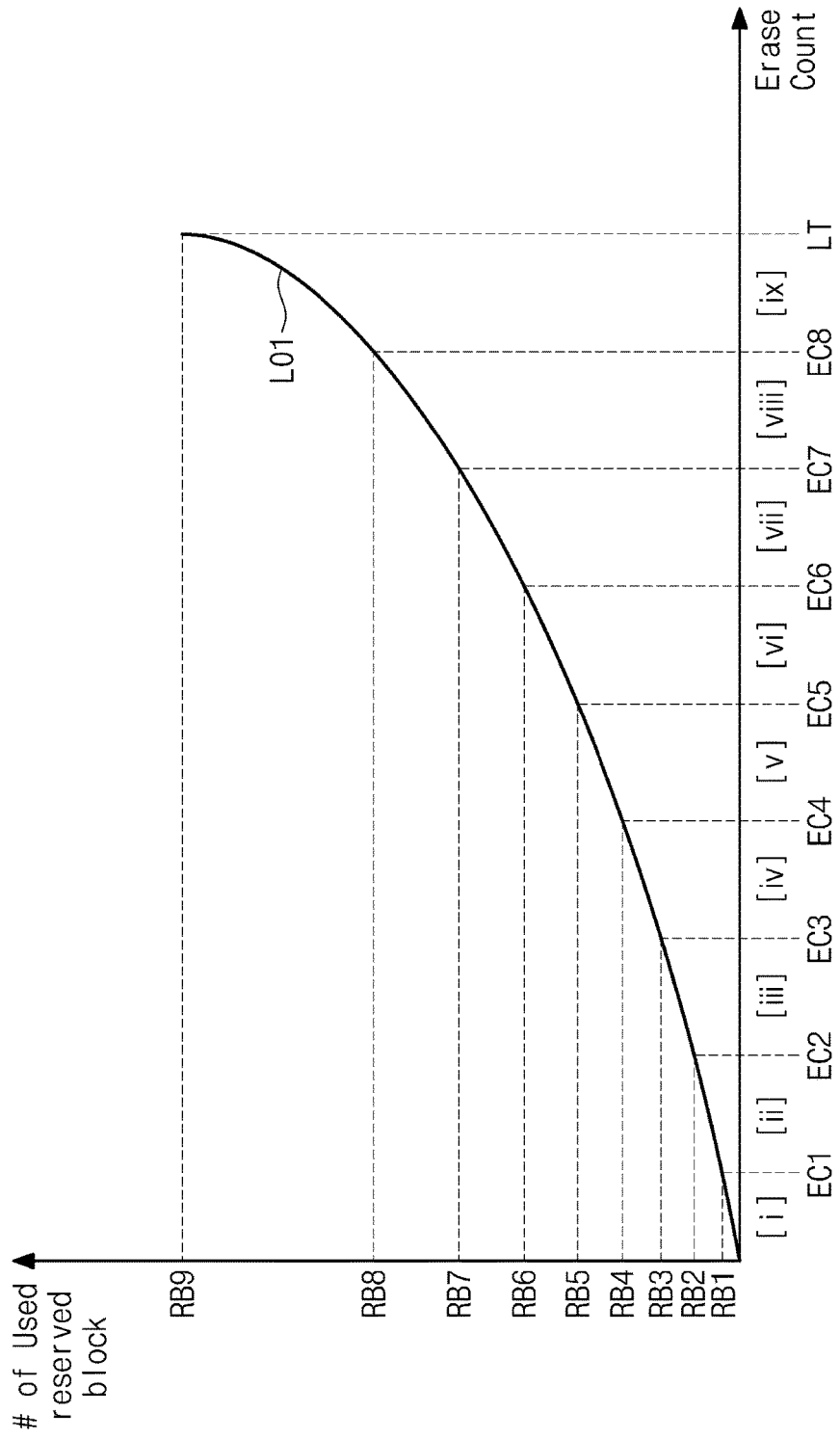
FIGS. 9 through 11 are drawings for explaining an operation of the memory controller of FIG. 8.
Figure 10:
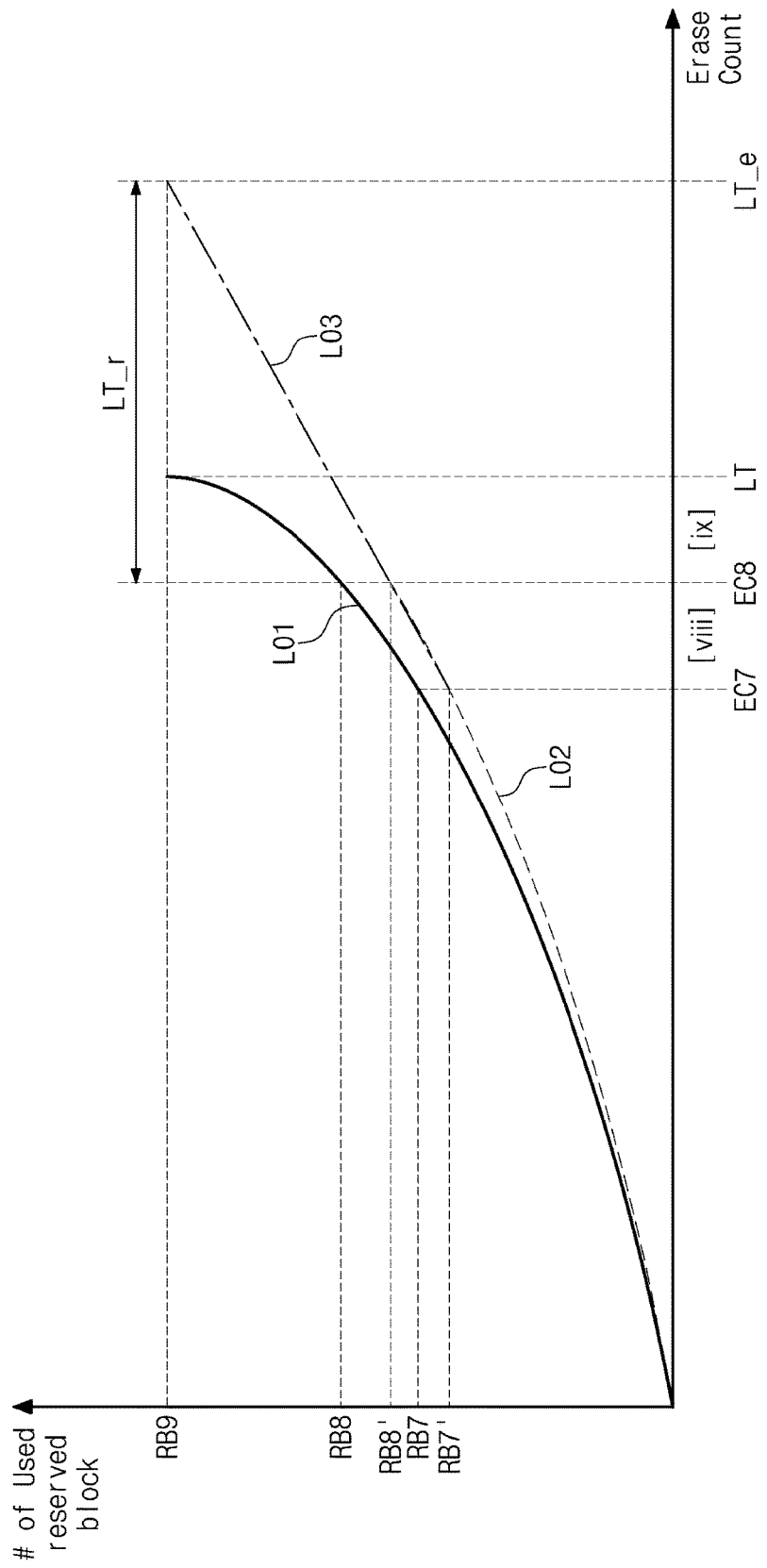
Figure 11:
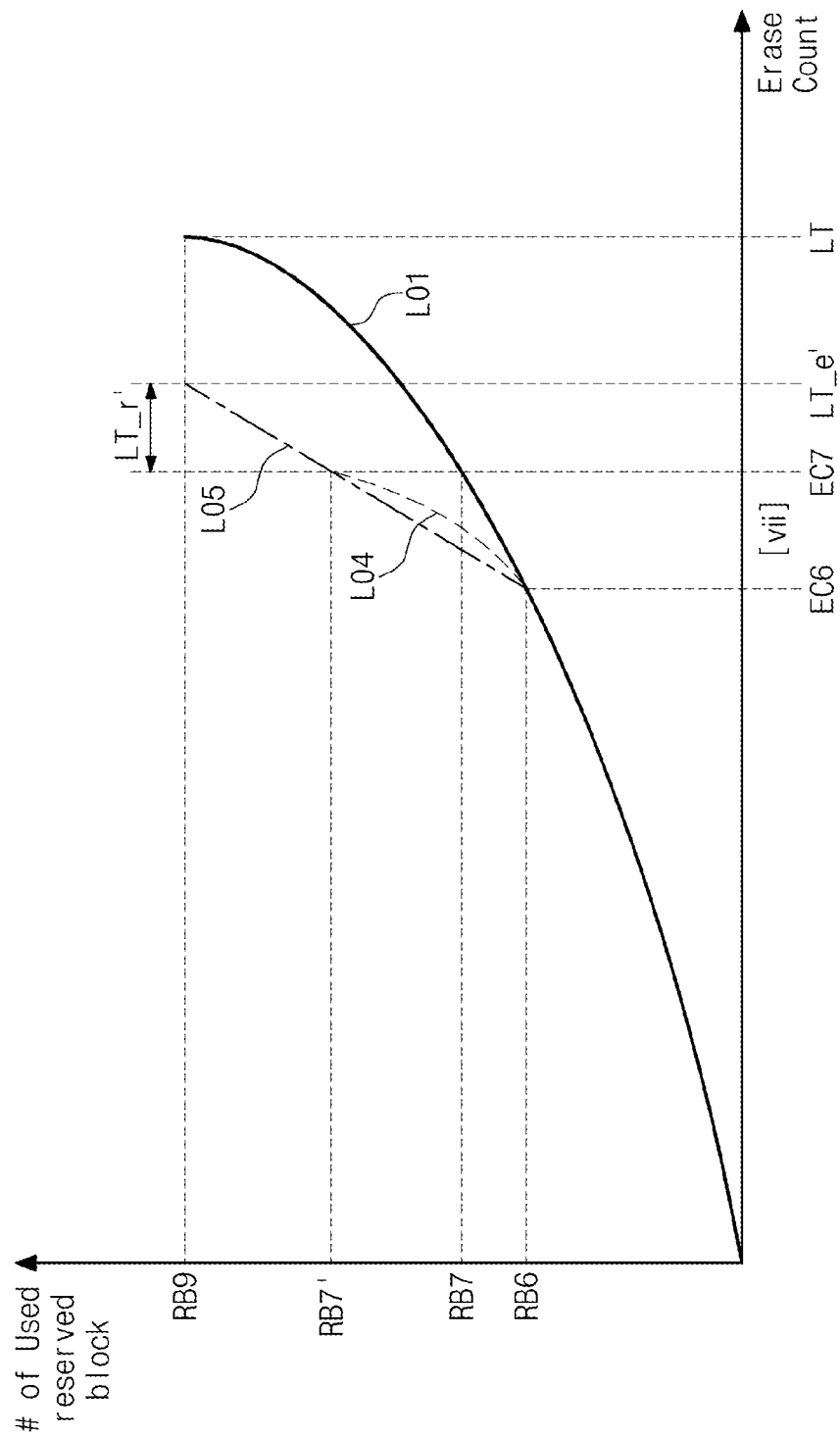

Operation of the memory controller of FIG. 8 in exemplary embodiments is illustrated in FIGS. 9 through 11, in which X axes indicate an erase count and Y axes indicate the number of used reserved blocks. With reference to FIG. 9 for example, a first line L01 illustrates usage of a general reserved block with respect to an erase count E/C of the nonvolatile memory device 130. In this example, a first number RB1 of reserved blocks are used during a first erase count EC1, a second number RB2 of reserved blocks are used during a second erase count EC2, etc. In this example, the memory controller 120 is effectively dividing an erase count of the nonvolatile memory device 130 into a plurality of periods (i, ii, iii, iv, v, vii, viii, ix) indicating periods of time between respective erase counts EC1, EC2, . . . , EC8, until the expected lifetime LT is reached. Accordingly, each of the periods (i, ii, iii, iv, v, vii, viii, ix) may be defined by an erase count of the nonvolatile memory device 130.

In exemplary embodiments, the erase counts corresponding to each of the periods (i, ii, iii, iv, v, vii, viii, ix) may be identical to one another. The first period (i) may be a period for treating an initial bad block. The memory controller 120 may divide the remaining erase counts into the periods (ii, iii, iv, v, vii, viii, ix) to manage them.

As illustrated in FIG. 9, as the erase count of the entire nonvolatile memory device 130 increases, the number of reserved blocks used in each of the time periods (i, ii, iii, iv, v, vii, viii, ix) also increases. This is because as the erase count increases, bad block generation increases by wear leveling of the FTL 122, so that the number of bad blocks used in each of the time periods (i, ii, iii, iv, v, vii, viii, ix) may vary.

The memory controller 120 may check the usage of a reserved block at every erase count of 1K. That is, the periods (i, ii, iii, iv, v, vii, viii, ix) could be divided into an erase count of 1K, respectively. In this case, the usage of reserved blocks in the second period (ii, i.e., during an erase count of 1K~2K) may be larger than the usage of reserved blocks in the first period (i, i.e., during an erase count of 0K~1K). Similarly, the usage of reserved blocks in the ninth period (ix, i.e., during an erase count of 8K~9K) may be larger than the usage of reserved blocks in the eighth period (viii, i.e., during an erase count of 7K~8K).

As an illustrative example, if the ratio of reserved blocks used in the eighth period (viii) is 20%, an erase count of the nonvolatile memory device 130 may be 8K, and the memory controller 120 may calculate that the remaining erase count of the nonvolatile memory device 130 is 1, based on the ratio (i.e., 1000/20%) of the usage of reserved blocks with respect to the erase count in the eighth period (viii) and the ratio (i.e., 20%) of the remaining reserved blocks. The remaining erase count indicates the remaining erase count of the nonvolatile memory device 130 before the reserved blocks are all used. Accordingly, it may be judged that at this point the lifetime of the nonvolatile memory device 130 is over. Of course, as usual, the numerical values described above are for explanatory purposes only, and the inventive concept and claimed subject matter are not limited thereto.

Referring to FIG. 10, the first line L01 illustrates a general relation between an erase count EC of the nonvolatile memory device 130 and the usage of reserved blocks. However, the relationship between the erase count EC of the nonvolatile memory device 130 and the usage of reserved blocks may change as represented by a second line L02 depending on a user's pattern of use.

In some exemplary embodiments, if the nonvolatile memory device 130 is used as much as the eighth erase count EC8, the memory controller 120 may detect the number (i.e., RB7'-RB8') of reserved blocks used during the eighth period (viii) and estimate an expected lifetime (LT_e) of the nonvolatile memory device 130 based on the detected number (i.e., RB7'-RB8') of reserved blocks. As illustrated in FIG. 10, the second line L02 indicates that the number of used reserved blocks in the seventh erase count EC7 is RB7' and the number of used reserved blocks in the eighth erase count EC8 is RB8'. The memory controller 120 may calculate a ratio based on the erase count of the eighth period (viii) and the detected number (i.e., RB7'-RB8') of reserved blocks. The calculated ratio may be reflected by the slope of the third line L03. The memory controller 120 may estimate an expected lifetime (LT_e) based on the third line L03.

The memory controller 120 may compare a current erase count (i.e., the eighth erase count EC8) with the expected lifetime (LT_e) to calculate a remaining expected lifetime (LT_r), and if the remaining expected lifetime (LT_r) is shorter than a reference lifetime, the memory controller 120 may transmit an end of lifetime warning signal EOL to the host 101.

As illustrated in FIG. 9, the lifetime of the nonvolatile memory device 130 may be LT. However, the lifetime of the nonvolatile memory device 130 may increase depending on a user's pattern of use. To account for this, the memory controller 120 may detect the number of reserved blocks used during a predetermined period in order to more accurately estimate an expected lifetime (or, a remaining expected lifetime) based on the detected number of reserved blocks, and may use the more accurate estimate to change the rate of use of reserved blocks, as illustrated in FIG. 10.

On the other hand, a user's pattern of usage may decrease the lifetime of the nonvolatile memory device 130. For example, with reference to FIG. 11, the first line L01 once again illustrates a general relationship between erase count EC of the nonvolatile memory device 130 and usage of reserved blocks. However, a pattern of usage may change this relationship, causing the usage of reserved blocks to reflect a fourth line L04. In that case, the reserved blocks of the nonvolatile memory device 130 may be all used up before the conventional expected lifetime, and therefore (in conventional examples) the memory device 130 may fail before a warning EOL signal is transmitted. Accordingly, in exemplary embodiments of the inventive concept the memory controller 120 may detect the number (i.e., RB7'-RB6) of reserved blocks used during the seventh period (vii) and may use that number to estimate a revised expected lifetime (LT_e') of the nonvolatile memory device 130. A ratio of the seventh period (vii) may be reflected by the slope of a fifth line L05.

To summarize, the memory controller 120 in accordance with exemplary embodiments of the inventive concept may calculate a ratio based on the number of reserved blocks used during a predetermined period and, since the expected lifetime (LT_e') is estimated based on the calculated ratio, the memory controller 120 may more accurately estimate an expected lifetime than is conventionally done, and may use that more accurate estimate to time transmission of a warning EOL signal according to the user's pattern of use. This has the advantage of giving an earlier warning signal when warranted so the memory device 130 may be replaced before it fails, and conversely has the advantage of giving a later warning when the actual lifetime will be longer, so as to allow more use of the memory device 130 before it is replaced due to the EOL warning signal.

Figure 12:
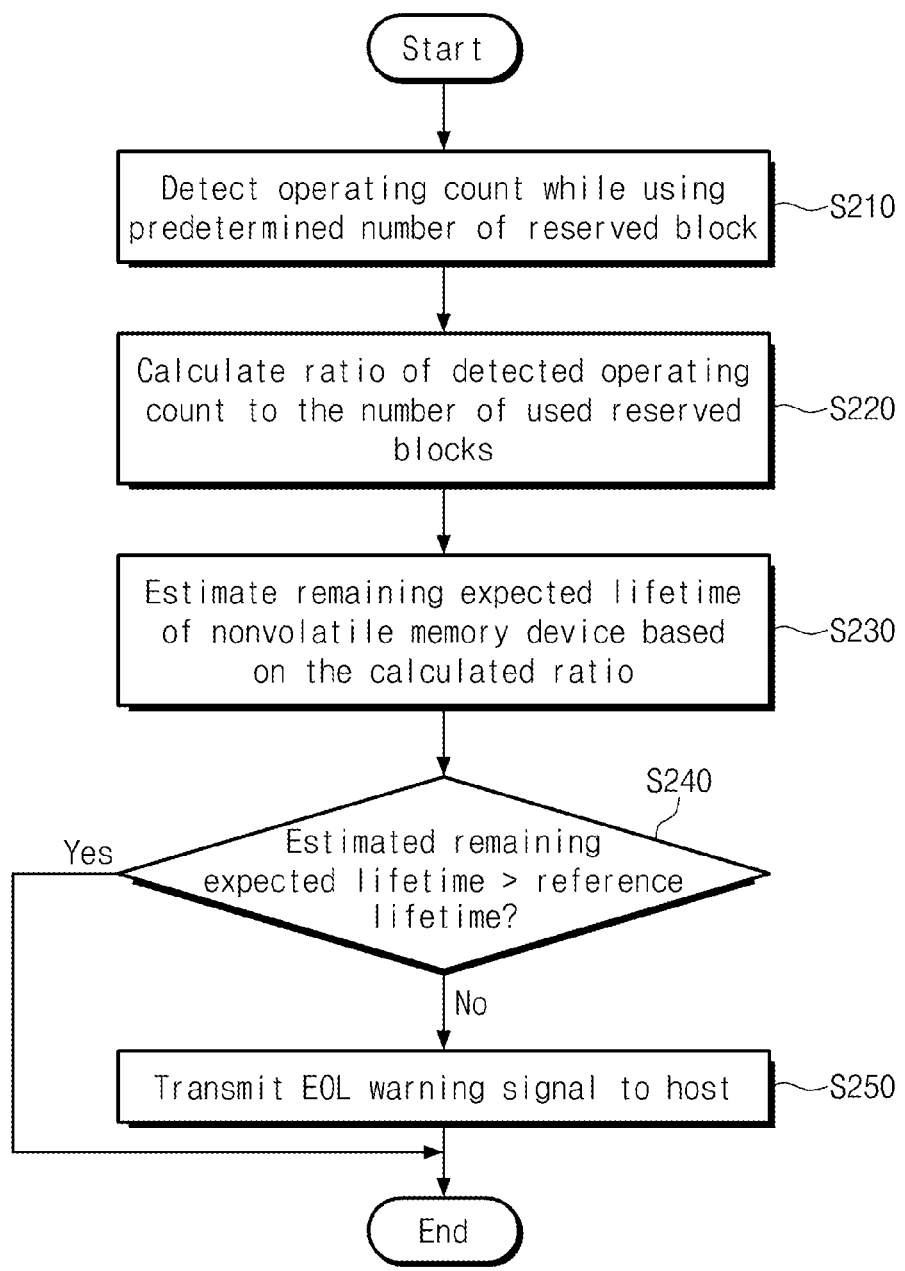
FIG. 12 is a flowchart illustrating an operating method of a memory controller in accordance with another embodiment of the inventive concept.

FIG. 12 is a flowchart illustrating a method of operation of a memory controller in accordance with another embodiment of the inventive concept. Referring to FIGS. 3 and 12, the memory controller 120 may detect (S210) an operation count during the time a predetermined number of reserved blocks is used. The operation count could, for example, indicate an erase count, a program count, a time count, etc. of the nonvolatile memory device 130. For ease of explanation herein we will assume for this example that the operation count is an erase count.

The memory controller 120 may then calculate (S220) a ratio of the detected operation count to the predetermined number of reserved blocks. The method may then continue (S230-S250) as previously explained (S130-S150) with reference to FIG. 8.

Additionally, the memory controller 120 may transmit an end-of-lifetime (EOL) lifetime warning signal to the host 101 if the calculated ratio is greater than a predetermined value. The calculated ratio may be stored in a separate storage circuit (e.g., register, fuse, etc.)

Operation of the memory controller 120 as illustrated in FIG. 12 thus uses a different reference variable than does the memory controller 120 as described in FIG. 8. Instead of detecting the number of reserved blocks used during a predetermined erase count, as reflected in FIGS. 8-11, in embodiments corresponding to FIGS. 12 and 13 the memory controller 120 detects an erase count that takes place during usage of a predetermined number of reserved blocks. It will be appreciated that even though these two methods use different reference variables they may still have the same effect.

Figure 13:
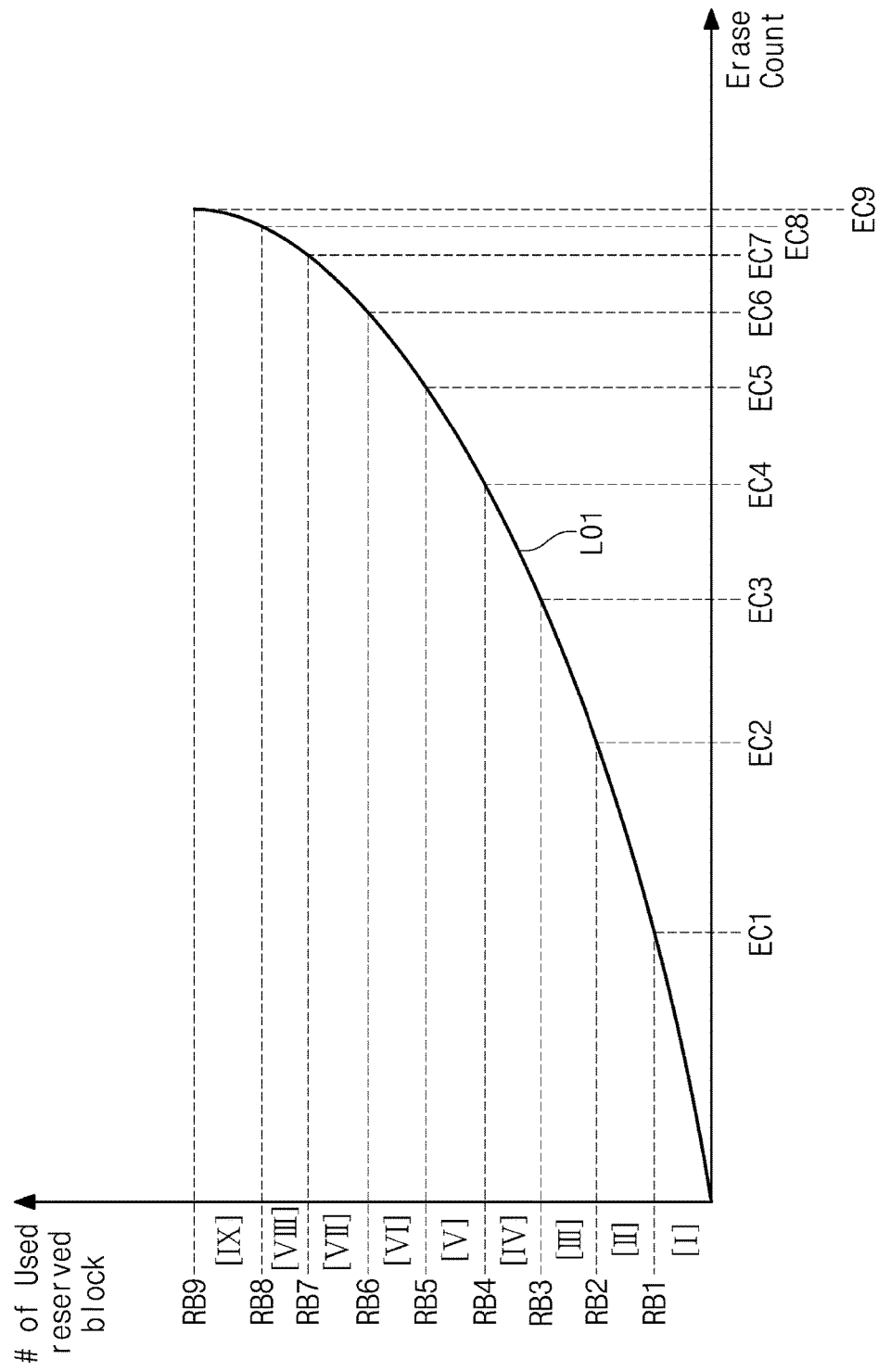
FIG. 13 is a graph for explaining an operating method of the memory controller of FIG. 12.

FIG. 13 illustrates an example of operation of the memory controller of FIG. 12. In FIG. 13, an X axis indicates an erase count E/C and a Y axis indicates the number of used reserved blocks. Referring to FIG. 13, a first line L01 illustrates the general usage of reserved blocks with respect to an erase count E/C of the nonvolatile memory device 130. Since first through ninth erase counts (EC1~EC9) and first through ninth values (RB1~RB9) of the nonvolatile memory device 130 have been described with reference to FIG. 9, a detailed description thereof will be omitted here.

The memory controller 120 may divide the number of used reserved blocks into a plurality of periods (I, II, III, IV, V, VI, VII, VIII, IX) to manage them. In this embodiment a first period (I) indicates a period between an initial operation and a first value RB1, a second period (II) indicates a period between the first value RB1 and a second value RB2, and so on. The periods (I, II, III, IV, V, VI, VII, VIII, IX) may be periods defined by a plurality of reserved blocks.

The number of used reserved blocks of each of the periods (I, II, III, IV, V, VI, VII, VIII, IX) may be identical to one another. In exemplary embodiments, the first period (I) may be a period for treating an initial bad block. The memory controller 120 may divide the remaining the number of used reserved blocks outside the period for treating an initial bad block into the periods (II, III, IV, V, VI, VII, VIII, IX) to manage them.

As illustrated by the first line L01, as the number of used reserved blocks increases, the erase count occurring during successive periods (I. II, III, IV, V, VI, VII, VIII, IX) may decrease, so that as the number of used reserved blocks increases, the ratio of the erase count to the number of used reserved blocks may increase. Accordingly, operation of memory controller 120 as described with reference to FIGS. 12 and 13 may have the same effect as its operation as described with reference to FIGS. 8 through 11.

Each of the periods (I, II, III, IV, V, VI, VII, VIII, IX) may be divided into the usage of reserved blocks of 10%. That is, the number of reserved blocks being used in each of the periods (I. II, III, IV, V, VI, VII, VIII, IX) may be 10% of the whole reserved block. Assuming that a reserved block for treating an initial bad block is 10% of the whole reserved block, the ninth value RB9 may indicate the number of the whole reserved block. That is, if the usage of the reserved block reaches the ninth value RB9, it may be judged that the lifetime of the nonvolatile memory device 130 is over.

If the usage of the reserved block is 90% and an erase count (i.e., EC8-EC7) in the eighth period VIII is 1 k, the memory controller 120 knows that the remaining erase count of the nonvolatile memory device 130 is 1K, i.e., usage of the reserved block used during the eighth period VIII may be 10%, based on the ratio of the erase count with respect to the usage of reserved block in the eighth period VIII and the usage of the remaining reserved block.

Once again, the numerical values described herein are for explanatory purposes only, and the inventive concept and claimed subject matter are not limited thereto.

Figure 14:
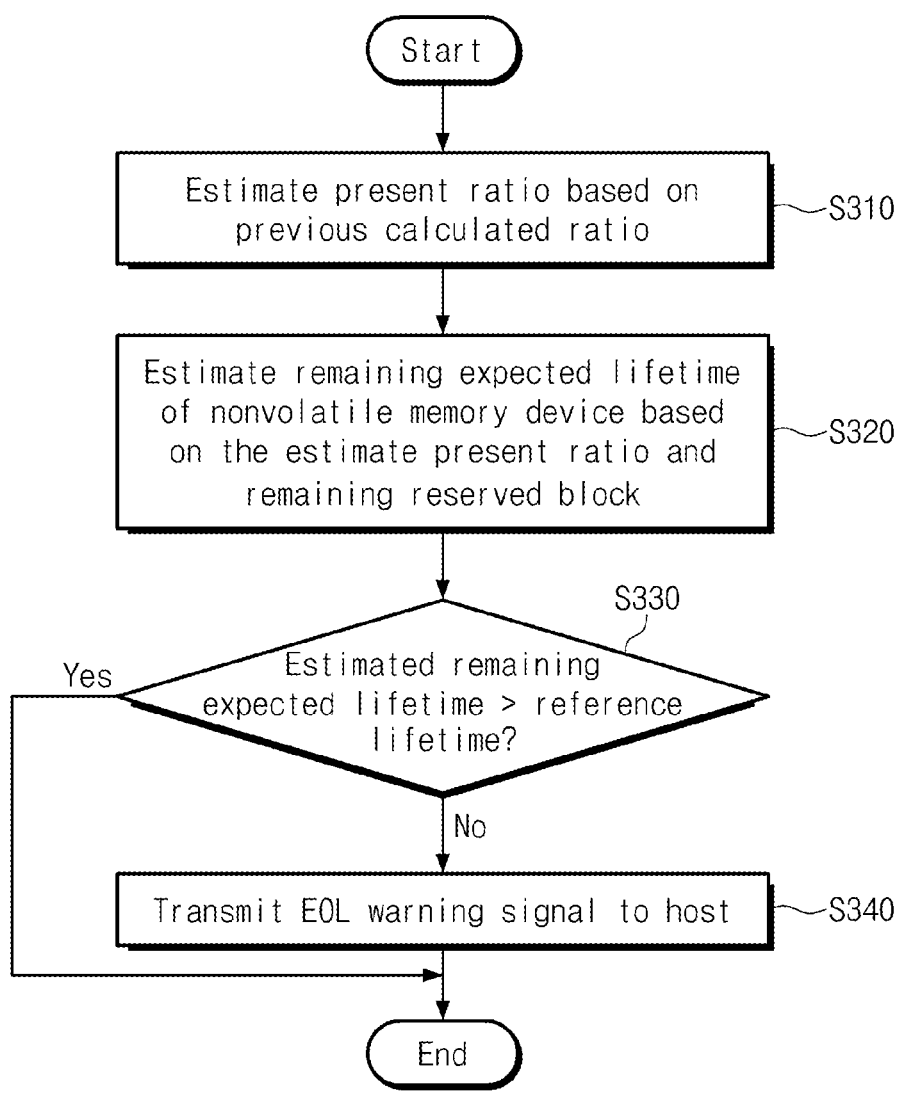
FIG. 14 is a flowchart illustrating an operating method of a memory controller in accordance with yet another embodiment of the inventive concept.

FIG. 14 is a flowchart illustrating an operating method of a memory controller in accordance with still another embodiment of the inventive concept. Referring to FIGS. 1 and 14, the memory controller 120 may estimate (S310) a current ratio based on the previously calculated ratio, for example a ratio with respect to each period has described with reference to FIGS. 8-13. The memory controller 120 may estimate a current ratio based on a ratio with respect to each period.

The memory controller 120 may then estimate remaining expected lifetime based on the estimated current ratio, and the process may continue (S330, S340) as described (S140, S150) with reference to FIG. 8.

Figure 15:
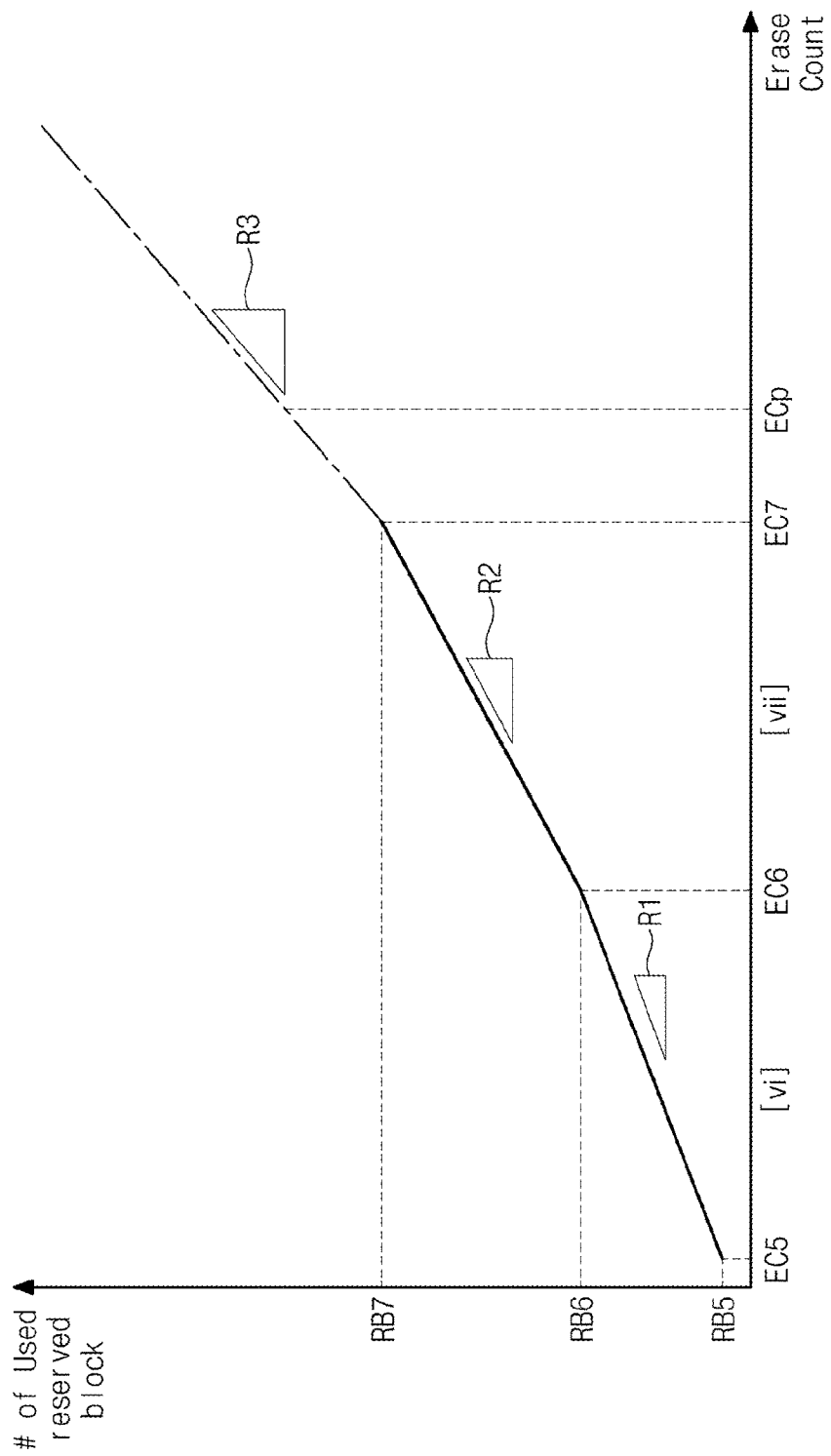
FIG. 15 is a graph for explaining an operation of the memory controller of FIG. 14 in detail.

FIG. 15 illustrates operation of the memory controller of FIG. 14 in more detail. An X axis indicates an erase count and a Y axis indicates the number of used reserved blocks. For simplicity, only the sixth and seventh periods (vi, vii) are illustrated and it is assumed that the reference period for lifetime estimation is an erase count as in the embodiment reflected in FIG. 8, although the inventive concept and claimed subject matter are not limited thereto.

Referring to FIG. 15, if the erasure count of the nonvolatile memory device 130 reaches the value EC5, reserved blocks of a fifth value RB5 will have been used. When the erasure count reaches a sixth erase count EC6, reserved blocks of a sixth value RB6 will have been used, etc. The number of the reserved used blocks in the sixth period (vi) may be RB6-RB5. The memory controller 120 may calculate a ratio of the sixth period (vi) based on the erase count of the sixth period (vi) and the number (RB6-RB5) of used reserved blocks. The calculated ratio may be reflected by a first slope R1, which may have a value of (RB6-RB5)/(EC6-EC5). The calculated ratio may be stored in a separate storage circuit (e.g., SRAM 123, a fuse, a register, etc.).

The memory controller 120 may then calculate a ratio in the seventh period (vii) in the same manner as described above. The ratio of the seventh period (vii) may equal a second slope R2, which may have a value of (RB7-RB6)/(EC7-EC6). The second slope R2 may be greater than the first slope R1. The calculated ratio may be stored in a separate storage circuit (e.g., SRAM 123, a fuse, a register, etc.)

Eventually, the nonvolatile memory device 130 may reach an erase count ECp, at which time the memory controller 120 may estimate a current ratio based on the previously calculated ratios (i.e., ratios of the sixth and seventh periods (vi, vii)). For example, as an erase count is increased, the bad block generation ratio may increase as a result of a wear leveling operation performed by the FTL 122, thereby increasing reserved block usage. That is, as illustrated in FIG. 15, as erase count increases, a calculated ratio may increase. Thus, the memory controller 120 may estimate a current ratio based on incrementing previously calculated ratios. An estimated current ratio may be the same as a third slope R3, which may be greater than the second slope R2.

For example, suppose an erase count in the sixth period (vi) is 1K and the usage of the reserved blocks used in the sixth period (vi) is 15% of the whole reserved blocks, and an erase count in the seventh period (vii) is 1K and the usage of the reserved block used in the seventh period (vii) is 18% of the whole reserved block. In that case, the usage of the reserved block used in the seventh period (vii) will be larger than the usage of the reserved block usage in the sixth period (vi). Accordingly, as erase count increases the number of reserved blocks being used may increase. The memory controller 120 may estimate that the usage of reserved blocks after the seventh period (vii) is 21% of the whole reserved block find per erase count of 1K based on the usage of reserved blocks in the sixth and seventh periods (vi, vii).

The memory controller 120 may detect the remaining erase count of the nonvolatile memory device 130 based on the number of remaining reserved blocks and the estimated ratio (i.e., 21% of the whole reserved block per erase count of 1K). If the detected remaining erase count is less than a specific value, the memory controller 130 may transmit an end of lifetime warning signal EOL to an external device.

Once again, the numerical values described herein are for explanatory purposes only, and the inventive concept and claimed subject matter are not limited thereto.

FIG. 16 further illustrates operation the memory controller of FIG. 15. The lifetime managing unit 121 may manage ratio information for each period. For example, the lifetime managing unit 121 may divide an erase count of the nonvolatile memory device 130 into a plurality of periods. The lifetime managing unit 121 may include ratio information calculated in each period. Ratios calculated in first through n−1th periods may be the same as first through n−1th slopes R1~Rn−1 respectively. In this case, the n−1th slope Rn−1 may have the greatest value and the first slope R1 may have the smallest value.

The nonvolatile memory device 130 may operate in an nth period. The lifetime managing unit 121 may estimate a current ratio based on the ratio calculated in first through n−1th periods. The estimated current ratio may be the same as a slope Rp which may exceed an n−1 th slope Rn−1 by a predetermined value. The lifetime managing unit 121 may estimate an expected lifetime of the nonvolatile memory device 130 based on the estimated current ratio.

As an example, suppose the nonvolatile memory device 130 is operating in the nth period. Based on an erase count of 1K per period, the first slope R1 in the first period may indicate 10% of the whole reserved block, the second slope R2 in the second period may indicate 12% of the whole reserved block, third slope R3 in the third period may indicate 14%, etc., until the n−1 th slope Rn−1 in the n−1th period may indicate 20% of the whole reserved block. In that case, the memory controller 120 may estimate that the slope Rp in the nth period is 22% of the whole reserved block per an erase count increase of 1K, based on the increase per period of the reserved block percentage usage observed in previous periods.

Once again, the numerical values described herein are for explanatory purposes only, and the inventive concept and claimed subject matter are not limited thereto.

The ratio information per each period being managed by the lifetime managing unit 121 may be stored in a separate storage circuit (e.g., SRAM 123, a fuse, a register, etc.) or may be flushed to the nonvolatile memory device 130 for example.

Figure 17:
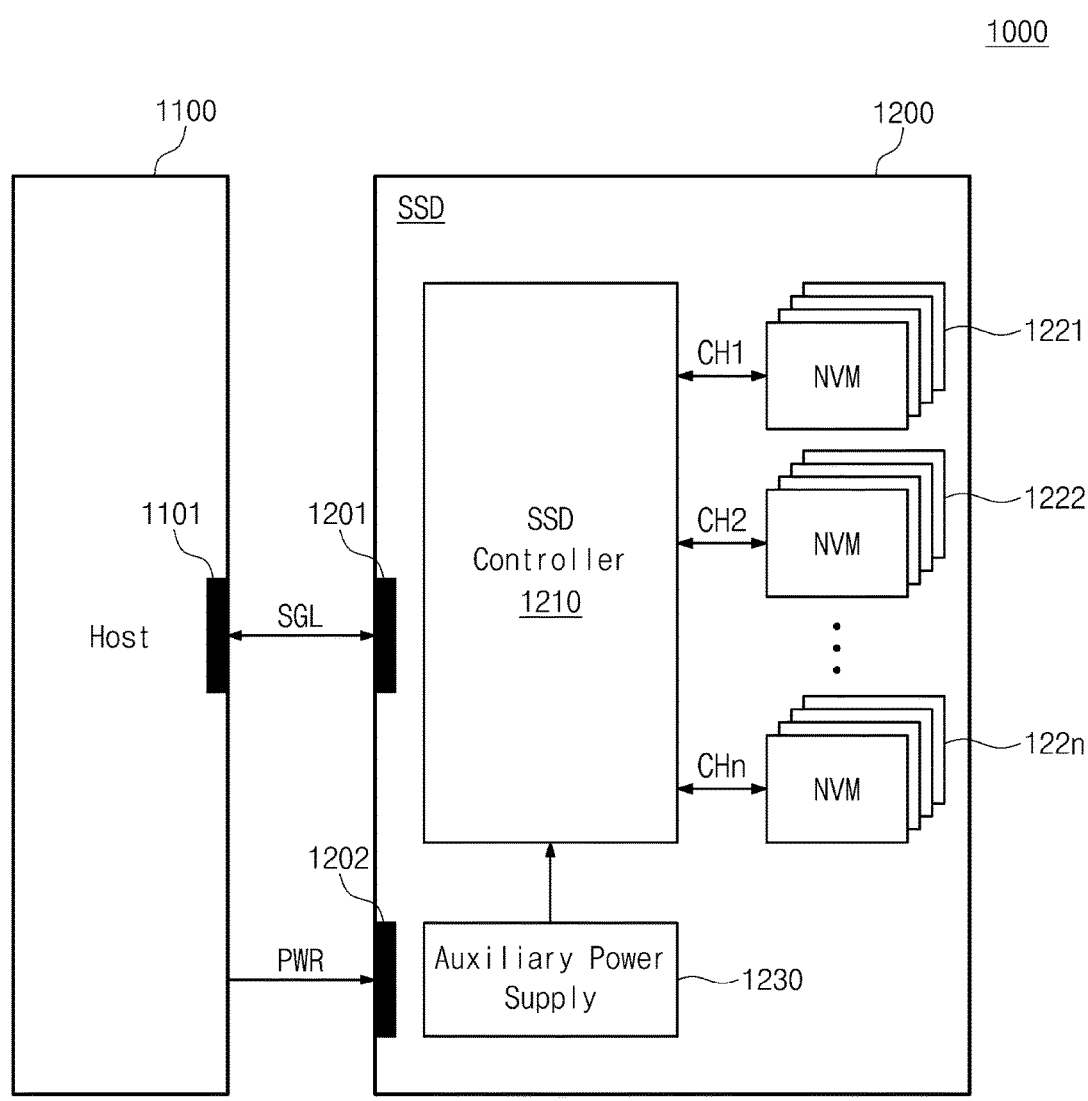
FIG. 17 is a block diagram illustrating a solid state drive SSD including a nonvolatile memory device in accordance with one or more embodiments of the inventive concept.

Referring to FIG. 17, a solid state drive (SSD) system 1000 may include a host 1100 and an SSD 1200. The host 1100 may write data to the SSD 1200 or read data that has been stored in the SSD 1200. The host 1100 may exchange a signal SGL such as a command, an address, and/or state information with the SSD 1200 through a host interface 1101. The host interface 1101 may include various interfaces such as a USB (universal serial bus), an MMC (multimedia card), a PCI (peripheral component interconnection), a PCI-E (PCI-express), an ATA (advanced technology attachment), a serial-ATA, a parallel-ATA, an SCSI (small computer small interface), an ESDI (enhanced small disk interface), an IDE (integrated drive electronics), an MIPI (mobile industry processor interface), etc.

The SSD 1200 may exchange a signal SGL with the host 1100 through the host interface 1101 and may receive power through a power connector 1202. The SSD 1200 may include a plurality of nonvolatile memory devices 1221~122n, a SSD controller 1210, and an auxiliary power supply 1230. The nonvolatile memory devices 1221~122n may alternatively be embodied by a PRAM, a MRAM, an ReRAM, a FRAM, etc., in place of or in addition to a NAND flash memory.

The nonvolatile memory devices 1221~122n may be used as a storage medium of the SSD 1200. The nonvolatile memory devices 1221~122n may be connected to a SSD controller 1210 through a plurality of channels CH1~CHn. One or more nonvolatile memory devices may be connected to one channel. A nonvolatile memory being connected to one channel may be connected to the same data bus.

The signal SGL exchanged between the host 1100 and the SSD 1200 may be exchanged between the SSD controller 1210 and the host 1100 through the host interface 1201. The signal SGL may include a command, an address, data, etc. The SSD controller 1210 may write data in a corresponding nonvolatile memory device according to a command of the host 1100, and/or may read data from a corresponding nonvolatile memory device.

An auxiliary power supply 1230 may be connected to the host 1100 through the power connector 1202. The auxiliary power supply 1230 may receive power from the host 1100, to be charged for example. The auxiliary power supply 1230 may be located inside or outside the SSD 1200. For example, the auxiliary power supply 1230 may be located on a main board to provide auxiliary power to the SSD 1200.

The SSD controller 1210 may estimate lifetime of the nonvolatile memory devices 1221~122n and/or of the SSD 1200.

A memory controller in accordance exemplary embodiments comprising the inventive concept may detect the number of reserved blocks used during a predetermined operation count (e.g., an erase count, a program count, a time count, etc.) and may estimate the lifetime of a nonvolatile memory system based on the number of used and/or unused reserved blocks. By thus more accurately estimating lifetime of the nonvolatile memory system than has been done conventionally, failure prediction and failure avoidance efficiency may be increased and performance of a nonvolatile memory system may be improved.

Figure 18:
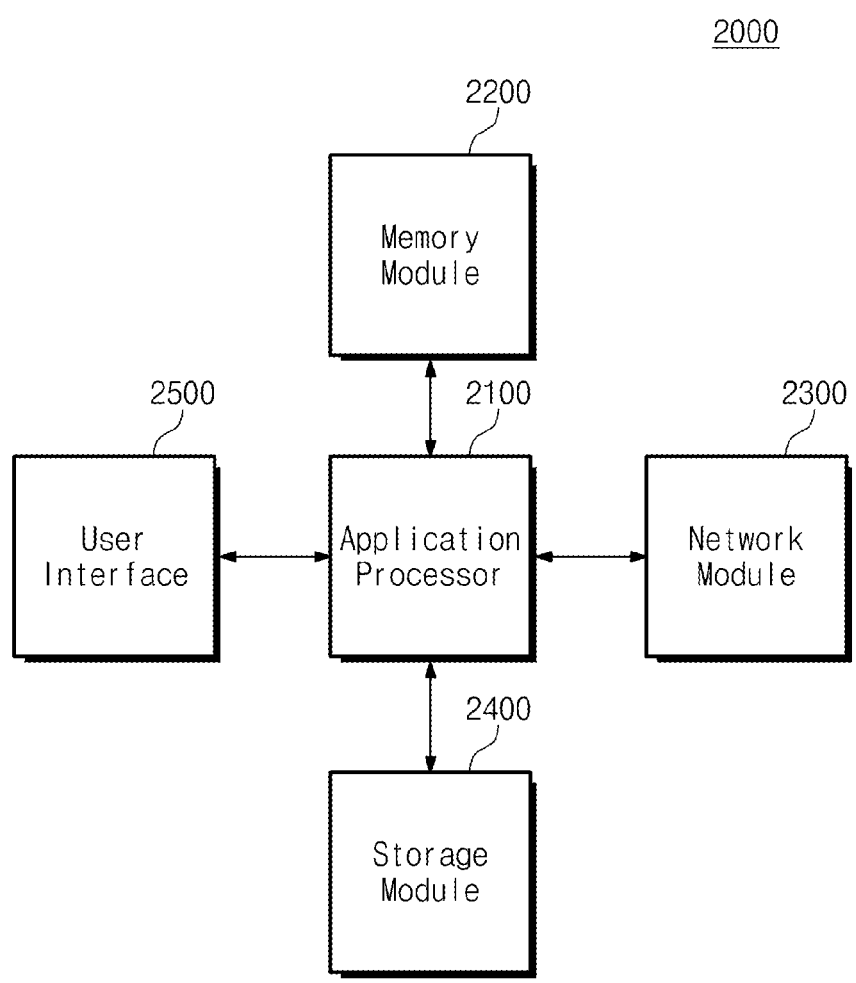
FIG. 18 is a block diagram illustrating a user system including a memory system in accordance with one or more embodiments of the inventive concept.

FIG. 18 is a block diagram illustrating a user system including a memory system in accordance with an embodiment of the inventive concept. Referring to FIG. 18, a user system 2000 includes an application processor 2100, a memory module 2200, a network module 2300, a storage module 2400 and a user interface 2500. The user system 2000 may be provided as a computing system such as an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, etc.

The application processor 2100 may drive constituent elements, an operating system, etc. included in the user system 2000, and may include a graphic engine, various interfaces, and controllers controlling constituent elements of the user system 2000.

The memory module 2200 may operate as a main memory, an operation memory, a buffer memory, or a cache memory. The memory module 2200 may include a volatile random access memory such as DRAM, SDRAM, DDR SDRAM, DDR2 SDRAM, DDR3 SDRAM, LPDDR DRAM, LPDDR2 DRAM, LPDDR3 DRAM, etc., or a nonvolatile random access memory such as PRAM, ReRAM, MRAM, FRAM, etc.

The network module 2300 may communicate with external devices and may support a wireless communication such as a CDMA (code division multiple access), a GSM (global system for mobile communication), a WCDMA (wideband CDMA), a CDMA-2000, a TDMA (time division multiple access), a LTE (long term evolution), a Wimax, a WLAN, a UWB, a blue tooth, a WI-DI, etc.

The storage module 2400 may store data, for example data received from outside, and may transmit data stored in the storage module 2400 to the application processor 2100. The storage module 2400 may be embodied by a semiconductor memory device such as a PRAM, a MRAM, a RRAM, a NAND flash, a NOR flash, a three-dimensional NAND flash, etc.

The storage module 2400 may serve as a nonvolatile memory system as described with reference to FIGS. 1 through 16, and may include the memory controller of such a system, and may estimate memory device lifetime as described with reference to FIGS. 1 through 16.

The user interface 2500 may include interfaces that input data or a command to the user system 2100, or output data to an external device. The user interface 2500 may include input devices such as a camera, a touch screen, an operation recognition module, a mike or output devices such as a display, a speaker, a touch screen, etc.

Figure 19:
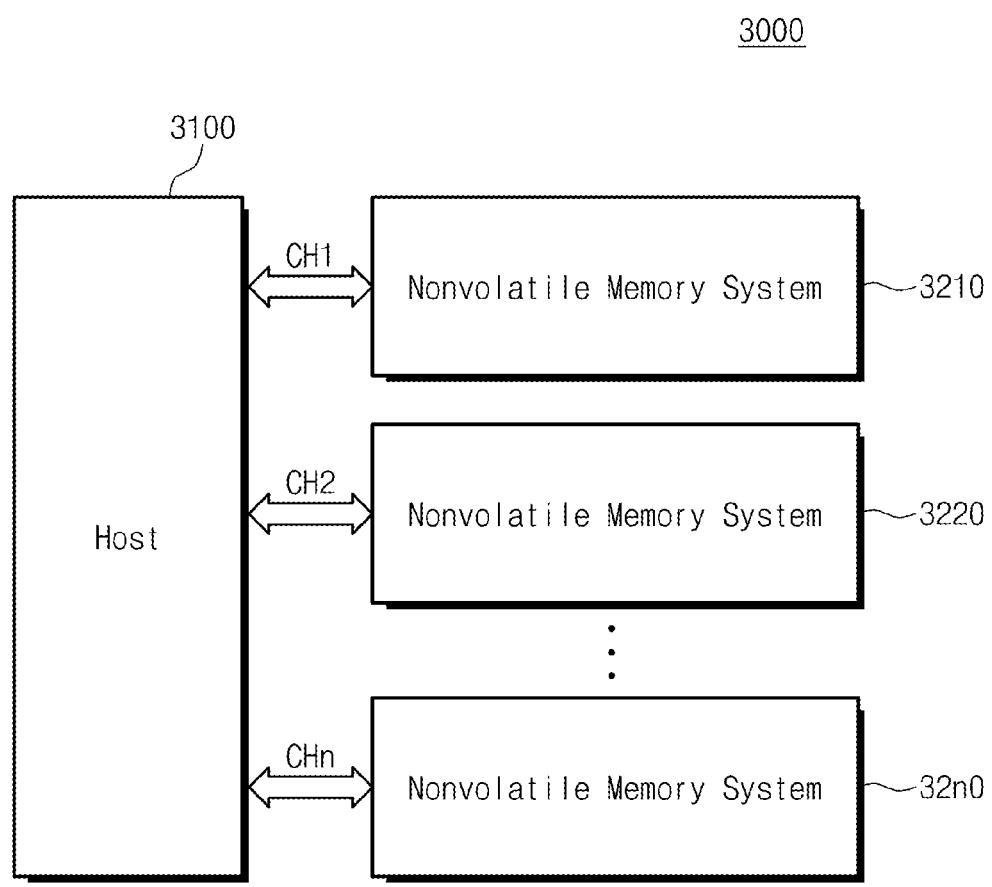
FIG. 19 is a block diagram illustrating a server system including a nonvolatile memory system in accordance with one or more embodiments of the inventive concept.

FIG. 19 is a block diagram illustrating a server system including a nonvolatile memory system in accordance with an embodiment of the inventive concept. Referring to FIG. 19, a server system 3000 includes a host 3100 and a plurality of nonvolatile memory systems 3210~32n0. The server system 3000 may be connected to an external user system through a wireless or wired communication network and may provide a service to the external user system. The server system 3000 may watch or control the whole communication network like printer control or file management. The server system 3000 may be connected to an external user system through a wireless or wired communication network and may share software resources such as data, program and file and hardware resources such as modem, facsimile, print, other equipment, etc.

The host 3100 may control the nonvolatile memory systems 3210~32n0. For example, through a plurality of channels CH1~CHn, the host 3100 may be connected to the nonvolatile memory systems 3210~32n0, may write data in the nonvolatile memory systems 3210~32n0, and may read data stored in nonvolatile memory systems 3210~32n0.

The host 3100 may perform a backup operation with respect to the nonvolatile memory systems 3210~32n0, for example periodically backing up data stored in the first nonvolatile memory system 3210 to the second nonvolatile memory system 3220.

The nonvolatile memory systems 3210~32n0 may be constituted by a RAID (redundant array of inexpensive disk). The nonvolatile memory systems 3210~32n0 may operate based on the operating method described with reference to FIGS. 1 through 16. For example, each of the nonvolatile memory systems 3210~32n0 may estimate a remaining expected lifetime and may transmit an end of lifetime warning signal to the host 3100 through the channels CH1~CHn based on the estimated remaining expected lifetime. The host 3100 may perform a backup operation in response to the end of lifetime warning signal.

According to the exemplary embodiments of the inventive concept, the memory controller may detect the number of reserved blocks used during a predetermined period and an erase count, to calculate a ratio of the erase count to the number of used reserved blocks. The memory controller may more accurately estimate an expected lifetime than conventional methods by estimating lifetime of the nonvolatile memory system based on the calculated ratio.

Although not illustrated in the drawing, the memory controller may include a separate state check module performing the lifetime estimation method in accordance with the embodiments of the inventive concept. The state check module included in the memory controller may estimate lifetime of the nonvolatile memory device based on methods described herein.

Embodiments of the inventive concept may be included in a function related to a SMART (self-monitoring, analysis and reporting technology) of the nonvolatile memory system. For example, the nonvolatile memory system may support a SMART related function defined as standard. An end of lifetime warning signal may be included in one of SMART commands.

A nonvolatile memory system has been described based on an erase count, but the inventive concept is not limited thereto. Lifetime of the nonvolatile memory system may be estimated by using program count, I/O count, usage time, etc. The number of used reserved blocks may extend to a remap count.

According to inventive concept, by more accurately estimating a lifetime of a nonvolatile memory system than conventionally, failure prediction and failure avoidance efficiency of a nonvolatile memory system may be increased, and the method of operation and/or performance of a nonvolatile memory system may be improved.

The above-disclosed subject matter is to be considered illustrative, and not restrictive, and the appended claims are intended to cover all possible modifications, enhancements, and other embodiments that fall within the spirit and scope of the inventive concept as defined by the claimed subject matter. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of operating a memory controller that controls a nonvolatile memory device including a plurality of user blocks and a plurality of reserved blocks, comprising:
    calculating, by the memory controller, a ratio of a number of used reserved blocks among the plurality of reserved blocks during a predetermined period and an operation count during the predetermined period;
    estimating, by the memory controller, a remaining expected lifetime of the nonvolatile memory device based on the ratio;
    transmitting, by the memory controller, an end of lifetime warning signal to an external device when the estimated remaining expected lifetime is shorter than a reference value; and
    causing the memory controller to replace one or more bad blocks among the plurality of user blocks with one or more of the plurality of reserved blocks when the one or more bad blocks become bad,
    wherein the number of used reserved blocks signifies a number of the plurality of reserved blocks that have been used to replace said one or more bad blocks, and
    the operation count is at least one of an erase count of the nonvolatile memory device, a program count of the nonvolatile memory device, and a time count indicating usage time.

2. The method of claim 1, wherein said predetermined period corresponds to a predetermined count of the operation count; and said ratio is a ratio of the number of said used reserved blocks to the operation count.

3. The method of claim 1, wherein said predetermined period corresponds to a period in which a predetermined number of reserved blocks among the plurality of reserved blocks are used; and said ratio is a ratio of the operation count to the number of the used reserved blocks.

4. The method of claim 1, wherein said estimating said remaining expected lifetime is based at least in part on a number of reserved blocks of said plurality of reserved blocks that are not used reserved blocks.

5. The method of claim 1, wherein the end of lifetime warning signal is included in a SMART (Self-Monitoring, Analysis and Reporting Technology) command.

6. A method of operating a memory controller that controls a nonvolatile memory device including a plurality of user blocks and a plurality of reserved blocks, comprising:
    calculating, by the memory controller, for each period of a plurality of periods, a respective ratio of a number of used reserved blocks among said plurality of reserved blocks to an operation count of the nonvolatile memory device;
    storing, by the memory controller, the respective calculated ratios;
    estimating, by the memory controller, a current ratio based at least in part on said stored calculated ratios;
    transmitting, by the memory controller, an end of lifetime warning signal to an external device based on the estimated current ratio;
    causing the memory controller to replace one or more bad blocks among the plurality of user blocks with one or more of said plurality of reserved blocks when the one or more bad blocks become bad,
    wherein the number of used reserved blocks signifies a number of said plurality of reserved blocks that have been used to replace the one or more bad blocks, and
    said operation count is at least one of an erase count, a program count, and usage time of the nonvolatile memory device; and
    incrementing at least one of said stored calculated ratios as part of said estimating said current ratio.

7. The method of claim 6, wherein said each period is defined by the operation count of the nonvolatile memory device.

8. The method of claim 6, wherein said each period is defined by the number of used reserved blocks.

9. The method of claim 6, wherein the estimated current ratio is higher than said stored calculated ratios.

10. The method of claim 6, wherein said transmitting said end of lifetime warning signal to said external device comprises:
    estimating remaining expected lifetime of the nonvolatile memory device based on the estimated current ratio; and
    transmitting the end of lifetime warning signal to the external device based on a comparison of the estimated remaining expected lifetime to a reference value.

11. The method of claim 6, comprising transmitting said end of lifetime warning signal to the external device when the estimated current ratio is greater than a predetermined value.

12. A user system for memory control comprising:
a nonvolatile memory including a plurality of user blocks and a plurality of reserved blocks; and
a memory controller configured to control the nonvolatile memory by
calculating a ratio of a number of used reserved blocks among the plurality of reserved blocks during a predetermined period and an operation count during the predetermined period,
estimating a remaining expected lifetime of the nonvolatile memory based on the ratio,
transmitting an end of lifetime warning signal to an external device based on the estimated remaining expected lifetime, and
causing the memory controller to replace one or more bad blocks among the plurality of user blocks with one or more of the plurality of reserved blocks when the one or more bad blocks become bad,
wherein the number of used reserved blocks signifies a number of the plurality of reserved blocks that have been used to replace the said one or more bad blocks,
wherein the operation count is at least one of an erase count of the nonvolatile memory, a program count of the nonvolatile memory, and a time count indicating usage time, and
wherein said predetermined period corresponds to a predetermined count of the operation count, and said ratio is a ratio of the number of said used reserved blocks to the operation count, or
said predetermined period corresponds to a period in which a predetermined number of reserved blocks among the plurality of reserved blocks are used, and said ratio is a ratio of the operation count to the number of the used reserved blocks.

13. The user system of claim 12, wherein transmitting said end of lifetime warning signal to said external device based on the ratio comprises:
transmitting the end of lifetime warning signal to the external device when the estimated remaining expected lifetime is shorter than a reference value.

14. The user system of claim 12, including a host computer configured to transmit and receive signals to and from the memory controller, said signals comprising:
first data, and first instructions to write said first data to said nonvolatile memory; and
second instructions to read second data from said nonvolatile memory,
said first data and said second data comprising a same or different data with respect to each other.

* * * * *